United States Patent [19]

Buckley et al.

[11] 4,399,004

[45] Aug. 16, 1983

[54] PHOTOELECTROCHEMICAL GOLD PLATING PROCESS

[75] Inventors: Reginald R. Buckley, Summit; Lucian A. D'Asaro, Madison; Paul A. Kohl, Chatham; Frederick W. Ostermayer, Jr., Chatham; Catherine Wolowodiuk, Chatham, all of N.J.

[73] Assignee: Bell Telephone Laboratories, Incorporated, Murray Hill, N.J.

[21] Appl. No.: 272,517

[22] Filed: Jun. 11, 1981

[51] Int. Cl.³ ........................ C25D 5/02; C25D 7/12
[52] U.S. Cl. .................................. 204/15; 204/32 S
[58] Field of Search ................ 204/15, 325, DIG. 3

[56] References Cited

U.S. PATENT DOCUMENTS 3,013,955 12/1961 Roberts ............................... 204/15
3,890,215 6/1975 DiLorenzo ...................... 204/129.2
4,144,139 3/1979 Durkee ............................... 204/15
4,251,327 2/1981 Grenon ............................... 204/15

OTHER PUBLICATIONS

J. of the Electrochemical Society, vol. 108, No. 8, Aug. 1961, pp. 790-794.
J. of the Electrochemical Society, vol. 119, No. 8, Aug. 1972, pp. 1063-1078.
Electronics Letters vol. 13, Feb. 1977, pp. 171-172.
J. of the Electrochemical Society, vol. 126, No. 5, May 1979, pp. 855-859.
Soviet Physics, Technical Physics, vol. 21, No. 7, Jul. 1976, pp. 857-859.
Electronics Letters, vol. 12, No. 6, Mar. 18, 1976, pp. 133-134.
Solid-State Electronics, vol. 24, 1981, pp. 337-342.

*Primary Examiner*—T. M. Tufariello
*Attorney, Agent, or Firm*—Walter G. Nilsen

[57] ABSTRACT

A process is described for plating gold on metal surfaces electrically attached to a compound semiconductor. The procedure is particularly valuable where gold is to be in small holes or crevices in semiconductor structure since electroplating on the semiconductor surface is avoided. The process is useful for providing low inductance electrical connection to various parts of semiconductor devices such as to the source in gallium arsenide field-effect transistors.

18 Claims, 2 Drawing Figures

U.S. Patent    Aug. 16, 1983    4,399,004

PHOTOELECTROCHEMICAL GOLD PLATING PROCESS

TECHNICAL FIELD

The invention is a process for plating gold on metallized surfaces electrically attached to a III–V semiconductor surface. In one embodiment of the invention, gold is plated in small via holes in certain types of transistor structures.

BACKGROUND OF THE INVENTION

The discovery of new materials and the development of new methods of making better materials has lead to many new applications in the semiconductor field. These new applications often require different fabrication techniques, particularly as related to smaller size, greater precision in locating various features of the device, adherence of metallic substances to semiconductor surfaces, etc.

A particular example is a device involving compound semiconductors. Various types of devices can be made using compound semiconductors including semiconductor lasers, detectors, light emitting diodes and amplifiers. A typical example is associated with the fabrication and structure of certain microwave semiconductor devices made from various compound semiconductors. Here, minimization of parasitic inductances is critical to good device performance. It permits higher frequency operation and more gain and bandwidth at the high frequencies. Also, more positive attachment of gold to the metal pads ensures good electrical contact and good thermal contact. This permits higher power handling capacity for the device and a higher and more predictable frequency characteristic for the device.

Particularly desirable is a reliable procedure for inducing plating at preselected areas on a compound semiconductor structure. In semiconducting processing, it is highly desirable that this be accomplished without electrical connection to individual devices. In particular, accurate direction of plating processes such as gold plating processes would be highly advantageous in the fabrication of various semiconductor devices. Various references have discussed the deposition of metals on semiconductors including an article entitled "New Semiconductor Contact Technology", by A. B. J. Sullivan, Electronic Letters, Vol. 12, No. 6 (18 March 1976), page 133.

SUMMARY OF THE INVENTION

The invention is a process for fabricating III–V compound semiconductor devices in which at least one step involves plating gold on a metallic surface electrically attached to the compound semiconductor. This gold plating is induced by photoelectrochemical oxidation of the compound semiconductor material. The compound semiconductor may be undoped, semi-insulating (compensated) or n-type. The gold plating process involves chemical reduction of a gold-containing species at the metal surface. Often, the metallic surface is also gold, although any other metallic surface may be used. The thickness of the metal may be varied as needed from many microns down to molecular thicknesses. The process is carried out in an electrolyte which dissolves the oxidation products of the semiconductor and contains a source of the gold to be plated which on reduction yields metallic gold. A particularly advantageous embodiment of the invention is gold plating within via holes in gallium arsenide field-effect transistors (GaAs-FET). The process permits gold plating without a plating power supply, electrical connections to the device or wires. Excellent plating results are obtained even in crevices and holes too small for conventional plating procedures. The procedure yields plated gold with good thermal and electrical contact to the metallic surface. In addition, when the process is used to electrically connect the source pads of GaAs-FET devices to the header by way of a via hole, more reliable, reproducible devices are obtained with better heat and frequency handling capabilities. Other applications include fabrication of electrodes, other metal layers, source pads, drain pads and gate pads on the semiconductor surface.

DETAILED DESCRIPTION

Figure 1:
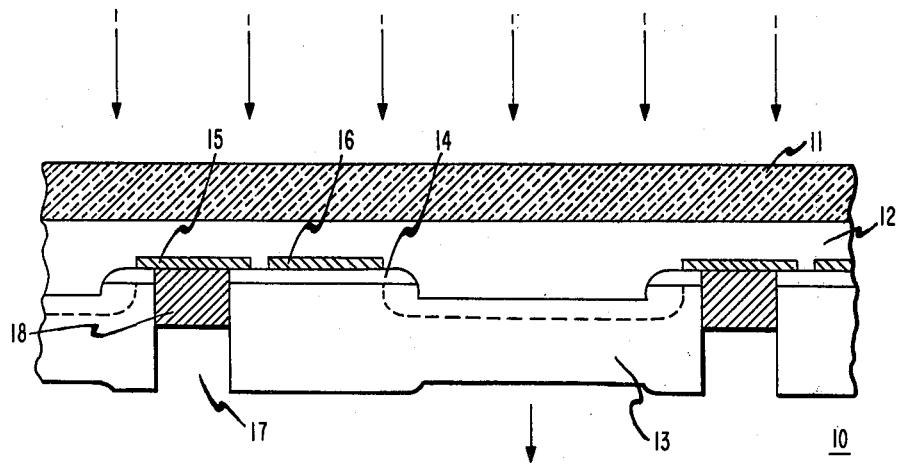
FIG. 1 shows a side view of a portion of a semiconductor wafer after gold has been plated in a via hole.

The invention involves a photoelectrochemical procedure for plating gold on metallic surfaces attached to a compound semiconductor surface. The procedure essentially consists of photo-oxidizing the compound semiconductor and allowing reduction to occur on a metal surface attached to the surface of the compound semiconductor. The solution is provided with a soluble species which on reduction yields metallic gold. The solution is also provided with substances that dissolve the oxidation products of the photo-oxidation of the compound semiconductor. This ensures continuity of the plating process.

The invention applies most particularly to pure (undoped) compound semiconductors, to semi-insulating compound semiconductors that have been made by doping to form traps in the band gap and to n-type compound semiconductors. Essentially, the compound semiconductor should not be predominantly p-type. Generally, hole concentration should not exceed electron concentration by more than a factor of 100. In essence, the semiconductor properties should be such that the hole concentration is significantly changed in the photo-oxidation part of the process by the irradiation. This in turn brings holes to the surface so as to participate in the photo-oxidation reaction. These holes are brought to the surface by the field in the space charge layer. The invention pertains especially to III–V compound semiconductors since these semiconductors are used extensively in commercially important devices.

Typical III–V semiconductor compounds are GaP, GaAs, AlAs, AlP, AlSb, InP, InSb, InAs, GaInAs, GaInP, GaInAsP, GaAlP and GaAlAs. The invention is usefully applied to undoped material as well as compensated material. A typical compensated material is chromium doped gallium arsenide. Here, doping is usually in the range from $10^{15}$ to $10^{17}$ Cr/cm$^3$. This procedure yields resistivities generally greater than $10^5$ Ohm-cm. Oxygen is also useful as a compensating material.

The invention is also useful in processing n-type compound semiconductors. Various methods well known in the art are available for making n-type compound semiconductors. Typical for III–V compounds is doping with group IV elements (i.e., Si, Ge, Sn) to substitute for the group III element in the semiconductor or doping with group VI elements (S, Se, Te) to substitute for the group V element in the semiconductor. Typical doping levels are $10^{16}$ to $10^{19}$ donor atoms per cubic centimeters.

The photoelectrochemical plating procedure involves various procedures taking place essentially simultaneously. The compound semiconductor, including metal surface to be plated is immersed in an electrolytic solution which is described in more detail below. The surface of the compound semiconductor is illuminated with light that generates electron-hole pairs. The photon energy of the light should be equal to or greater than the band gap so as to produce the carriers in the two bands. Often, broad band sources are used for convenience, but where precise localization of the light is useful, a laser source might be used. Light is also useful in providing photoconductivity from the region where oxidation occurs to the metal surface where plating occurs. This is particularly desirable for semi-insulating semiconductors such as chromium-doped gallium arsenide because low conductivity will limit plating rate. Also, to limit plating to a particular area of the metal layer, part of the metal layer where plating is not wanted is often masked off. This masking is often accomplished by adhering the metal layer to a mounting surface, usually a transparent substrate. Typically, the semiconductor wafers are attached to transparent substrates, such as sapphire disks, for support. The electrolytic solution contains a source of gold (more precisely, a gold compound which on reduction yields metallic gold), one or more substances which will dissolve the oxidation products of the compound semiconductor, a salt which will ensure good ionic conductivity for the electrolytic solution and optionally a buffer to stabilize the pH of the solution. A great variety of gold salts may be used, including gold cyanide complex ion, other types of gold complex ions and gold salts such as gold chloride. Because of availability and the ease with which gold is reduced, potassium gold cyanide is preferred as a source of gold. Often, moderate amounts of free cyanide are included in the solution to ensure stability of the gold cyanide complex ion. The concentration of gold species may vary over large limits, including from say 0.001 Molar to saturation. Optimum concentrations usually depend largely on economic considerations rather than process performance considerations. For this reason, relatively low concentrations such as 0.01 to 0.2 Molar are usually preferred. Excess of cyanide ion, if any, might range from 0.1 to 10 times the concentration of gold cyanide ion. Generally, excess cyanide is not used.

Substances useful in dissolving the oxidation products of the compound semiconductor depend on the particular compound involved. Often moderate amounts of acid or base are enough to ensure solubility. Typically, pH values less than 4 or greater than 8 are used for this purpose. Intermediate values of pH may also be used if an appropriate anion is present. In the case of aluminum and to some extent indium, a basic solution is preferred, and the addition of chloride ion is often helpful in dissolving the resulting oxide. In the case of gallium arsenide, the presence of phosphate ion, which is part of the buffer system, promotes dissolution of the oxidation products. The addition of conducting salts is also beneficial. Typical amounts are 0.05 to 1 Molar solutions. Any substance that is substantially ionized and does not interfere in the oxidation-reduction process can be used. This requirement is often met by substances serving other functions in the solution such as a buffer or a substance to ensure dissolution of the oxidation products of the semiconductor.

Although a buffer system is not required to carry out the procedure it does ensure stability of the pH in the electrolytic solution which tends to stabilize the reaction. Typical buffer systems are the phosphate system (both the dihydrogen phosphate-hydrogen phosphate system and the hydrogen phosphate-phosphate system) and the citrate system. The concentrations involved may vary over large limits and are generally typical of those used in conventional electroplating processes. Typically, 0.05 to 1.0 Molar solutions are used.

The temperature of the process may vary over large limits, including from the freezing point to the boiling point of the electrolytic solution. Often, room temperature is preferred for convenience; but where more rapid plating is desired, a temperature between 40 and 75 degrees C. is preferred. A plating temperature between 50 and 60 degrees C. is most preferred.

The invention is advantageously illustrated by a description of a device and a description of the process used to plate gold in making the device. FIG. 1 shows a side view of a portion of a semiconductor wafer 10 with numerous individual GaAs-FET partially completed. The wafer is mounted on a sapphire disk 11, using a conventional wax 12. Much of the processing has already been done on the device. The main body of the device is made of semi-insulating gallium arsenide 13 made by doping gallium arsenide with approximately $10^{16}$ chromium atoms/cm$^3$. Various layers are put down onto the semi-insulating GaAs. An epitaxial layer 14 of n-type gallium arsenide is grown on the semi-insulating gallium arsenide and source pad 15 as well as drain pad 16 are included as shown. Gate pads are located between the source pads and the drain pads. The inventive process is useful in filling or partially filling the via holes 17 with gold 18 as shown. Usually the holes need not be completely filled. Individual devices are separated (often with a number of source-drain combinations on a single device) and brazed to a header. The brazing material is usually a gold-tin alloy. It is advantageous to keep the gold-tin alloy away from the source pads and the inside part of the via holes.

A typical procedure for plating gold in the via holes is as follows: After the via hole has been made, typically by a plasma etching technique, the wafers are subjected to a series of cleaning steps. First, the wafers are immersed in a cyanide solution (typically 0.2 Molar KCN) saturated with oxygen. This solution dissolved any gold sputtered from the source pads during plasma etching. The surface was then cleaned with a solution made up of three parts concentrated sulfuric acid, one part 30 percent hydrogen peroxide solution and one part water. This pretreatment prevented spurious gold plating on the sides of the via holes and on the surface of the gallium arsenide.

The wafers mounted on the sapphire disk were immersed in an aqueous plating solution composed of 4 gm/l KAu(CN)$_2$, 100 gm/l KH$_2$PO$_4$, and 28 gm/l KOH. The pH was approximately 7 and the plating process was carried out at a bath temperature of about 55 degrees C. Moderate bath agitation is normally used and the light intensity may be used to adjust the gold plating rate. Illumination was provided with a 500 watt tungsten halogen lamp and a lens was used to collect radiation and make the radiation rays essentially parallel. These provisions are not necessary but provide more efficient use of the light output from the lamp and a more uniform distribution of radiation on the surface of the semiconductor wafer.

Illumination can be from either or both sides of the device (either through the sapphire disk or onto the bottom side). Generally, it is more convenient and better results are obtained when illumination is through the sapphire disk.

Examination of these via holes under a microscope (usually after chemically etching away the GaAs with an aqueous etching solution of three parts sulfuric acid, one part peroxide solution and one part water) showed that the plated gold filled the holes without voids and formed an excellent electrical and thermal contact with the source pads.

Figure 2:
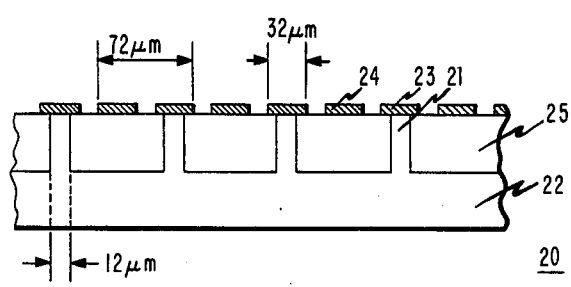
FIG. 2 shows a side view of a portion of a semiconductor wafer with gold header attached to the semiconductor device and to the gold-filled via hole.

FIG. 2 shows a side view of a semiconductor wafer 20 with a number of GaAs-FET in which the via hole 21 is filled with gold and the gold plating 22 on the bottom side of the device is completed. Shown are the source pads 23, drain pads 24 and the semi-insulating GaAs 25. The various dimensions of a typical device are also shown.

What is claimed is:

1. A process for fabricating devices comprising at least one n-type or intrinsic III-V compound semiconductor material comprising at least one step in which gold is plated on a metallic surface electrically connected to the III-V compound semiconductor by a oxidation-reduction reaction in an electrolytic solution characterized in that
    a. the oxidation is carried out by illuminating the III-V compound semiconductor with light with photon energy at least as great as the band gap of the compound semiconductor so as to create holes that permit oxidation of the semiconductor
    b. the electrolytic solution comprises a source of gold which on reduction yields metallic gold, and
    c. the source of gold is reduced on the metallic surface to form metallic gold.

2. The process of claim 1 in which the III-V compound semiconductor is selected from the group consisting of GaP, GaAs, AlAs, AlP, AlSb, InP, InSb, InAs, GaInAs, GaInP, GaInAsP, GaAlP and GaAlAs.

3. The process of claim 1 in which the III-V compound semiconductor is undoped.

4. The process of claim 1 in which the III-V semiconductor is semi-insulating GaAs.

5. The process of claim 4 in which the GaAs is made semi-insulating by doping with chromium in the concentration range from $10^{15}$ to $10^{17}$ Cr/cm$^3$.

6. The process of claim 2 in which the compound semiconductor is n-type.

7. The process of claim 6 in which the compound semiconductor is made n-type by doping with at least one element selected from the group consisting of Si, Ge, Sn, S, Se and Te.

8. The process of claim 1 in which the source of gold is gold cyanide complex ion.

9. The process of claim 8 in which the source of gold is potassium gold cyanide.

10. The process of claim 9 in which the concentration of potassium gold cyanide is between 0.01 to 0.2 Molar.

11. The process of claim 1 in which the electrolytic solution has pH less than 4.

12. The process of claim 1 in which the electrolytic solution has pH greater than 8.

13. The process of claim 1 in which the electrolytic solution contains chloride ion.

14. The process of claim 1 in which the electrolytic solution is buffered.

15. The process of claim 1 in which the electrolytic solution comprises conducting salts.

16. The process of claim 1 in which the electrolytic solution has a temperature between 40 and 75 degrees C. during the gold plating procedure.

17. The process of claim 1 in which the compound semiconductor is gallium arsenide, the gold is plated in a via hole and onto the source pad and the electrolytic solution comprises water and 1–40 gm/l KAu(CN)$_2$, 100 gm/l KH$_2$PO$_4$ and 28 gm/l KOH.

18. The process of claim 1 in which prior to plating the semiconductor is cleaned by a procedure comprising the steps of:
    a. immersing the compound semiconductor in a cyanide solution; and
    b. subsequently immersing the compound semiconductor in a solution consisting essentially of three parts sulfuric acid, one part peroxide solution and one part water.

* * * * *